(12) United States Patent
Carlen et al.

(10) Patent No.: US 8,181,531 B2
(45) Date of Patent: May 22, 2012

(54) ACCESSIBLE STRESS-BASED ELECTROSTATIC MONITORING OF CHEMICAL REACTIONS AND BINDING

(76) Inventors: Edwin Carlen, Enschede (NL); Marc S. Weinberg, Needham, MA (US); Angela Z. Uhland, Redwood City, CA (US); Jonathan Bernstein, Medfield, MA (US); John Aceti, Washington Crossing, PA (US); Malinda M. Tupper, Somerville, MA (US)

( * ) Notice: Subject to any disclaimer, the term of this patent is extended or adjusted under 35 U.S.C. 154(b) by 842 days.

(21) Appl. No.: 12/163,651

(22) Filed: Jun. 27, 2008

(65) Prior Publication Data

US 2009/0320606 A1    Dec. 31, 2009

(51) Int. Cl.
G01L 9/12    (2006.01)
(52) U.S. Cl. .................. 73/718; 73/715; 73/724; 73/753
(58) Field of Classification Search .................... 73/715, 73/718, 724, 753
See application file for complete search history.

(56) References Cited

U.S. PATENT DOCUMENTS

| | | |
|---|---|---|
| 4,171,246 A | 10/1979 | Hamblen et al. |
| 4,530,029 A | 7/1985 | Beristain |
| 4,568,445 A | 2/1986 | Cates et al. |
| 4,592,824 A | 6/1986 | Smith et al. |
| 4,682,602 A | 7/1987 | Prohaska |
| 4,814,060 A | 3/1989 | Banks |
| 4,874,500 A | 10/1989 | Madou et al. |
| 4,946,562 A | 8/1990 | Guruswamy |
| 4,951,174 A | 8/1990 | Grantham et al. |
| 4,984,467 A * | 1/1991 | Haefner .......................... 73/721 |
| 5,001,595 A * | 3/1991 | Dittrich et al. ............. 361/283.4 |
| 5,050,035 A | 9/1991 | Hegner et al. |
| 5,063,081 A | 11/1991 | Cozzette et al. |
| 5,156,810 A | 10/1992 | Ribi |
| 5,183,549 A | 2/1993 | Joseph et al. |
| 5,244,562 A | 9/1993 | Russell |
| 5,259,247 A | 11/1993 | Bantien |
| 5,262,127 A | 11/1993 | Wise et al. |
| 5,308,649 A | 5/1994 | Babacz |
| 5,339,051 A | 8/1994 | Koehler et al. |

(Continued)

FOREIGN PATENT DOCUMENTS

EP    0990885    4/2000

(Continued)

OTHER PUBLICATIONS

Baselt, D.R. et al., "Design and Performance of a microcantilever-based hydrogen sensor," Sensors and Actuators B., Elsevior Sequoia S.A., Lausanne, Ch., vol. 88, No. 2, pp. 120-131 (2003).

(Continued)

*Primary Examiner* — Lisa Caputo
*Assistant Examiner* — Jermaine Jenkins
(74) *Attorney, Agent, or Firm* — Goodwin Procter LLP

(57) ABSTRACT

A sensor may include a substrate that has a cavity formed in a surface thereof. A diaphragm, having a conductive portion, may be suspended over the cavity, a selective coating may be present on a face of the diaphragm outside of the cavity, and a counterelectrode may be spaced from and in opposition to the diaphragm. The diaphragm may deform upon interaction of the selective coating with an analyte and thereby alter a capacitance of the sensor in a manner indicative of a degree of interaction.

25 Claims, 13 Drawing Sheets

U.S. PATENT DOCUMENTS

| | | | |
|---|---|---|---|
| 5,348,649 A | 9/1994 | Mizuno et al. | |
| 5,417,115 A | 5/1995 | Burns | |
| 5,482,678 A | 1/1996 | Sittler | |
| 5,698,089 A * | 12/1997 | Lewis et al. | 205/787 |
| 5,958,201 A | 9/1999 | Craig et al. | |
| 6,030,827 A | 2/2000 | Davis et al. | |
| 6,114,658 A * | 9/2000 | Roth et al. | 219/209 |
| 6,167,748 B1 | 1/2001 | Britton, Jr. et al. | |
| 6,223,603 B1 * | 5/2001 | McKinnon | 73/718 |
| 6,431,003 B1 * | 8/2002 | Stark et al. | 73/718 |
| 6,447,449 B1 | 9/2002 | Fleischman et al. | |
| 6,457,750 B1 | 10/2002 | Sokurenko et al. | |
| 6,480,730 B2 | 11/2002 | Darrow et al. | |
| 6,534,316 B2 | 3/2003 | Strongin et al. | |
| 6,575,020 B1 | 6/2003 | de Charmoy Grey et al. | |
| 6,653,141 B2 | 11/2003 | Singaram et al. | |
| 6,664,407 B2 | 12/2003 | James et al. | |
| 6,673,533 B1 | 1/2004 | Wohlstadter et al. | |
| 6,730,201 B1 | 5/2004 | Kuhlman et al. | |
| 6,746,960 B2 | 6/2004 | Goodman | |
| 6,797,152 B2 | 9/2004 | Freund et al. | |
| 6,804,544 B2 | 10/2004 | Van Antwerp et al. | |
| 6,805,781 B2 | 10/2004 | Sørensen et al. | |
| 6,835,553 B2 | 12/2004 | Han et al. | |
| 6,872,297 B2 | 3/2005 | Mansouri et al. | |
| 6,896,778 B2 | 5/2005 | Lauks | |
| 6,916,660 B2 | 7/2005 | Wang et al. | |
| 6,927,246 B2 | 8/2005 | Noronha et al. | |
| 6,933,164 B2 | 8/2005 | Kubena | |
| 6,968,743 B2 | 11/2005 | Rich et al. | |
| 7,078,554 B2 | 7/2006 | Daniloff et al. | |
| 7,086,258 B2 * | 8/2006 | Fisher et al. | 70/278.7 |
| 7,086,288 B2 | 8/2006 | Lee et al. | |
| 7,101,472 B2 | 9/2006 | Dineen et al. | |
| 7,105,352 B2 | 9/2006 | Asher et al. | |
| 7,186,566 B2 | 3/2007 | Qian | |
| 7,244,394 B2 | 7/2007 | Carney et al. | |
| 7,254,008 B2 | 8/2007 | Xie et al. | |
| 7,297,548 B2 | 11/2007 | Kawanishi et al. | |
| 7,305,883 B2 | 12/2007 | Khuri-Yakub et al. | |
| 7,306,672 B2 | 12/2007 | Hansen et al. | |
| 7,316,899 B2 | 1/2008 | McDevitt et al. | |
| 7,358,094 B2 | 4/2008 | Bell et al. | |
| 7,402,425 B2 * | 7/2008 | Weinberg et al. | 435/287.2 |
| 2003/0019299 A1 | 1/2003 | Horie et al. | |
| 2003/0027351 A1 | 2/2003 | Manalis et al. | |
| 2003/0186228 A1 | 10/2003 | McDevitt et al. | |
| 2003/0209451 A1 | 11/2003 | Dineen et al. | |
| 2003/0233882 A1 | 12/2003 | Mei | |
| 2004/0096357 A1 | 5/2004 | Majumdar et al. | |
| 2004/0180379 A1 | 9/2004 | Van Duyne et al. | |
| 2004/0231984 A1 | 11/2004 | Lauks et al. | |
| 2005/0123442 A1 | 6/2005 | Gu et al. | |
| 2005/0158245 A1 | 7/2005 | Lakowicz et al. | |
| 2005/0196877 A1 | 9/2005 | Weinberg et al. | |
| 2005/0265914 A1 | 12/2005 | Gu et al. | |
| 2006/0116585 A1 | 6/2006 | Nguyen-Dinh et al. | |
| 2006/0148096 A1 | 7/2006 | Jina | |
| 2006/0155179 A1 | 7/2006 | Muller et al. | |
| 2006/0178572 A1 | 8/2006 | March | |
| 2007/0036682 A1 | 2/2007 | Gu et al. | |
| 2007/0105176 A1 | 5/2007 | Ibey et al. | |
| 2007/0110672 A1 | 5/2007 | Bellott et al. | |
| 2008/0020478 A1 | 1/2008 | Lowe et al. | |
| 2008/0039792 A1 | 2/2008 | Meng et al. | |
| 2008/0074661 A1 | 3/2008 | Zhang et al. | |
| 2009/0014340 A1 | 1/2009 | Williams et al. | |

FOREIGN PATENT DOCUMENTS

| | | |
|---|---|---|
| EP | 1306449 | 5/2003 |
| JP | 01311240 | 12/1989 |
| WO | WO-99/30144 | 6/1999 |
| WO | WO-0010007 A2 | 2/2000 |
| WO | WO-0171336 | 9/2001 |
| WO | WO-02058551 A2 | 8/2002 |

OTHER PUBLICATIONS

Chatzandroulis, S., "Fabrication of single crystal Si cantilevers using a dry release process and application in a capacitive-type humidity sensor", Microelectronic Engineering, Elsevier Publishers BV., Amsterdam NL, vol. 61-62, pp. 955-961 (2002).

Pepper, J. et al., "Detection of proteins and intact microorganisms using microfabricated flexural plate silicon resonator arrays", Sensors and Actuators B., Elsevier Sequoia A.S., Lausanne, Ch., vol. 96, No. 3, pp. 565-575 (2003).

International Search Report for International Application No. PCT/US2005/006680 dated Jun. 13, 2005.

Baker et al., "Label-Free Sugar Detection Using Phenylboronic Acid-Functionalized Piezoresistive Microcantilevers," Anal Chem. 80 (13), Jul. 1, 2008, pp. 4860-4865.

Kanayama, "Interfacial Recognition of Sugars by Boronic Acid-Carrying Self-Assembled Monolayer," Langmuir 2000, 16, pp. 577-583.

Lei et al., "A Hydrogel-Based Implantable Micromachined Transponder for Wireless Glucose Measurement," Diabetes Technology & Terapeutics, vol. 8, No. 1, Feb. 2006, pp. 112-122.

Pribyl et al., "Quartz Crystal Biosensor for Detection of Sugars and Glycated Hemoglobin" Analytica Chemica Acta, vol. 530, No. 1, Feb. 7, 2005, pp. 75-84.

Takahashi et al., "Phenylboronic Acid Monolayer-Modified Electrodes Sensitive to Sugars," Langmuir, vol. 21, No. 11, May 24, 2005, pp. 5102-5107.

Examination Report for European Patent Application No. 05724263.8, mailed Sep. 4, 2008, 5 pages.

Written Opinion for International Application No. PCT/US2005/006680, mailed Jun. 13, 2005, 5 pages.

International Search Report for International Application No. PCT/US2008/066879, mailed Jan. 19, 2009, 7 pages.

Written Opinion for International Application No. PCT/US2008/066879, mailed Jan. 19, 2009, 8 pages.

Bakker et al. "Ion Sensors: Current Limits and New Trends," Analytica Chimica Acta, vol. 393, Issues 1-3, Jun. 30, 1999, pp. 11-18.

Buehler et al. "Designating a Water-Quality Monitor with Ion Selective Electrodes," Aerospace Conference, 2001, IEEE Proceedings, vol. 1, 2001, pp. 1/331-1/337.

English Translation of Office Action for Chinese Patent Application No. 200580012891.1, mailed Mar. 25, 2010, 12 pages.

Office Action for Japanese Patent Application No. 2007-501,916, mailed Mar. 8, 2011, 9 pages.

* cited by examiner

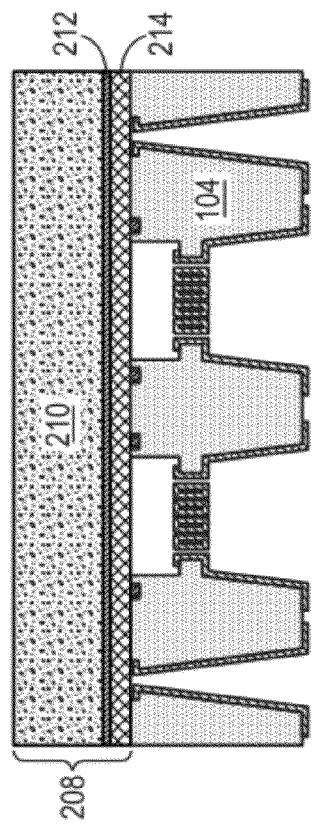
FIG. 2A
FIG. 2B
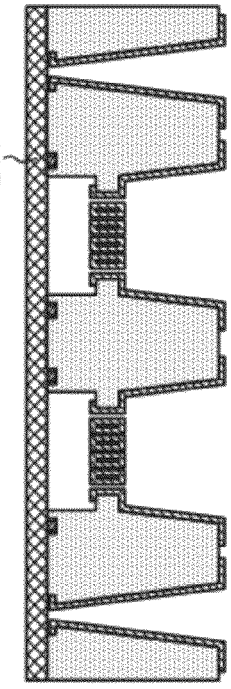
FIG. 2E
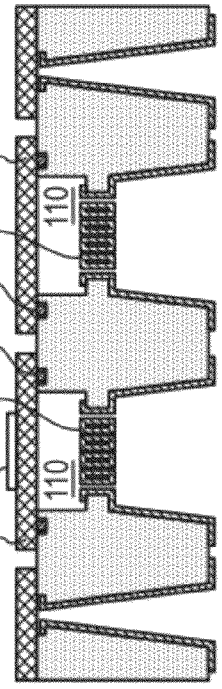
FIG. 2F
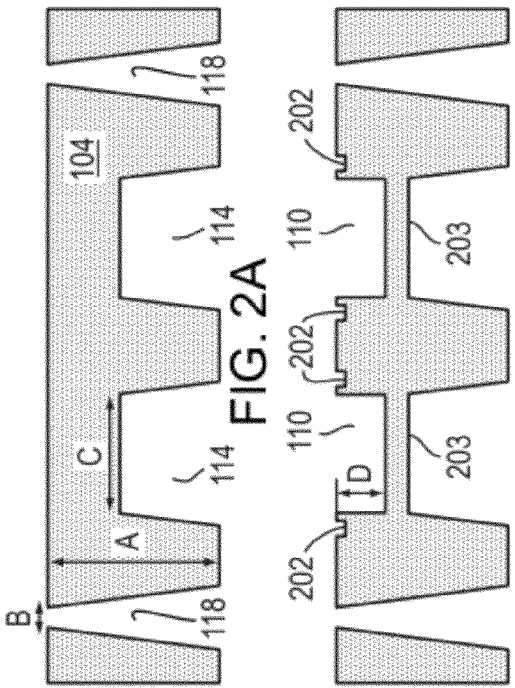
FIG. 2C
FIG. 2D
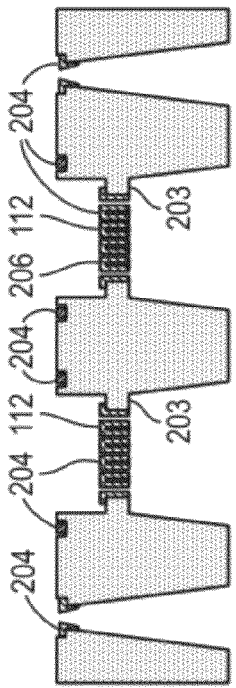
FIG. 2F
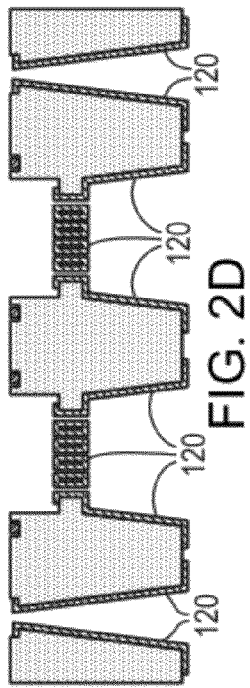
FIG. 2G

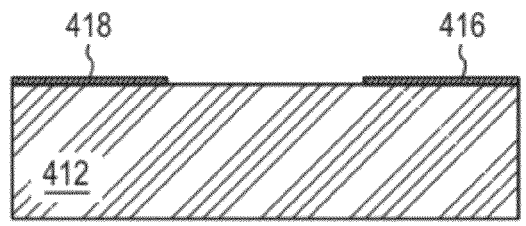
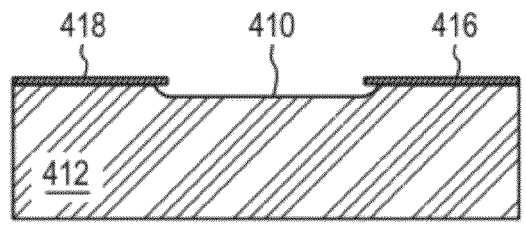
FIG. 5A  FIG. 5B
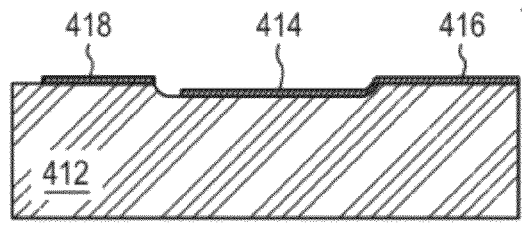
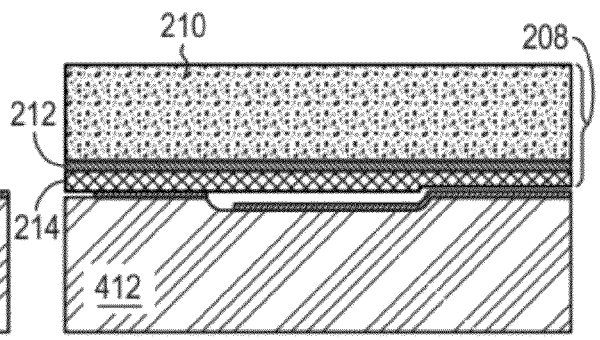
FIG. 5C  FIG. 5D
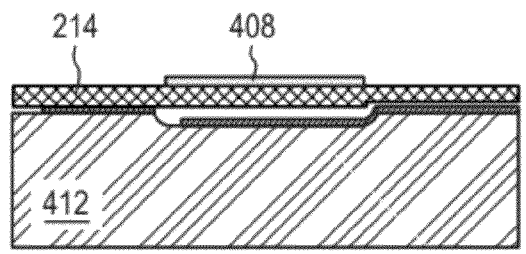
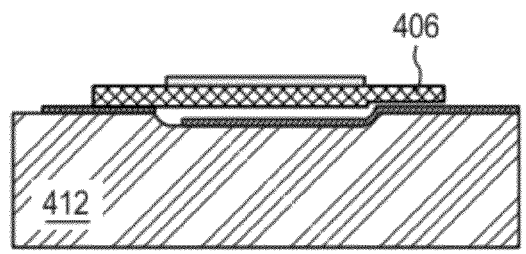
FIG. 5E  FIG. 5F
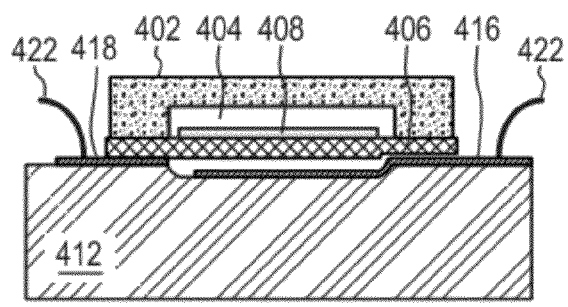
FIG. 5G

ACCESSIBLE STRESS-BASED ELECTROSTATIC MONITORING OF CHEMICAL REACTIONS AND BINDING

TECHNICAL FIELD

The present invention relates, in various embodiments, to stress-based electrostatic monitoring of chemical reactions and binding.

BACKGROUND

The presence and concentration of analytes, as well as the progress and efficiency of chemical reactions, are typically measured directly through optical monitoring if a reaction produces an observable change in light-absorption characteristics, or measured indirectly by observing, for example, changes in mass or volume. Many of the methods typically employed require attachment of a label compound whose properties-fluorescent, radioactive, chemiluminescent, or absorbing, for example-enable sensitive detection. These methods, however, typically require development of label reagents, add steps to the detection process, and modify the analyte. In the absence of label compounds, conventional measurements operate on a gross scale, and as a result require substantial amounts of analyte.

Enhanced sensitivity has recently been achieved using small micromachined cantilevers and flexural plate wave (FPW) sensors that facilitate the monitoring of chemical reactions and interactions on a microscopic scale. In the cantilever sensor, a selective coating applied to a face of the cantilever transduces the chemical reaction into a mechanical stress. This stress may be detected with a high degree of sensitivity. Cantilever arrangements may, however, be difficult to manufacture and to operate due to the small size and fragility of the fingers and due to the need to separate analytes from the readout mechanism. Because the cantilevers are delicate, applying the selective coatings may also be difficult. To separate the analytes from readout electronics, optical readouts employing reflection may be used. Cantilever-based approaches have achieved success primarily in specialized laboratories with personnel trained to handle the nuances of such devices.

FPW systems may utilize a diaphragm that is acoustically excited by interdigitated fingers to establish a standing wave pattern. The diaphragm is coated with the selective material, and interaction of analytes with the coating increases the effective thickness of the diaphragm, thereby affecting the frequency of the standing wave so as to indicate the degree of interaction. Because these devices are constructed of conducting, mechanical, and piezoelectric layers, bimetallic effects may produce unwanted temperature sensitivity. To reduce thermal distortions, FPW sensors are typically run at high resonant frequencies. Unfortunately, the high operating frequency itself limits sensitivity, in addition to requiring somewhat complex electronics.

Another approach transduces a chemical reaction into a mechanical stress applied to a diaphragm. The diaphragm is suspended in a narrow substrate cavity, and a selective coating that reacts to an analyte is applied to the diaphragm within the cavity. Because of the placement of the coating within the cavity, however, applying the coating consistently and evenly to the entire surface of the diaphragm is difficult, as is characterizing or modeling the unevenly applied coating. Further, the analyte of interest may take additional time to diffuse into the cavity from the outside environment, increasing the time required for measurements.

SUMMARY OF THE INVENTION

Described herein are embodiments of sensors and methods that overcome these issues by using electrostatic capacitance measurements to detect desired chemical or biological analytes, or chemical interactions, with great sensitivity. In one embodiment, a diaphragm is coated with a material capable of selectively interacting with an analyte of interest, and interaction of the analyte with the coating exerts stresses tangential to the diaphragm's surface. These stresses cause diaphragm displacements that are sensed as a varying capacitance between the diaphragm, which includes or consists essentially of a conductive material and thereby serves as an electrode, and a counterelectrode mounted in opposition to the diaphragm. In one embodiment, the diaphragm is suspended above a substrate cavity, and the selective coating is applied to a face of the diaphragm outside of the cavity. The coating thus may be applied to the diaphragm more consistently and modeled more accurately, and an analyte may be more easily applied to the coating. The diaphragm is preferably a single material, such as boron-doped silicon, to reduce or eliminate thermally induced deflections.

The coating may, for example, include polypeptides (e.g., antibodies), nucleic acids, or other biomolecules that interact with free analytes of interest. More generally, however, embodiments of the invention are amenable to use in connection with any molecular species susceptible to capture and binding as described below.

In general, in a first aspect, a sensor includes a substrate that has a first cavity formed in a first surface thereof. A diaphragm, which includes a conductive portion, may be suspended over the first cavity, and a counterelectrode may be spaced from and in opposition to the diaphragm. In one embodiment, the diaphragm deforms when a selective coating, applied to a first face of the diaphragm outside of the first cavity, interacts with an analyte. The deformation alters a capacitance of the sensor in a manner indicative of the degree of interaction.

In various embodiments, the sensor includes a means for equalizing pressure on the first face and a second face of the diaphragm. The pressure-equalizing means may be, for example, one or more perforations in the counterelectrode and/or a release channel in communication with the first cavity. The release channel may be formed through the substrate or be positioned between the diaphragm and the first surface of the substrate. The sensor may also include a wall member that is coupled to the diaphragm and forms a fluidic channel thereon.

The sensor may also include electronic circuitry for detecting the presence or concentration of the analyte based at least in part on the capacitance. The substrate, which may be made of (or include) glass, may have a second cavity formed in a second surface thereof, and may be coupled to through-wafer interconnects. The counterelectrode may be positioned within the first cavity, and the selective coating may include a polypeptide, an antibody, or an antigen.

In general, in a second aspect, a method of detecting binding to or reaction with a selective material includes providing a sensor having one or more of the features described above. The sensor capacitance may be measured to determine the degree of interaction between an analyte and the selective coating.

In various embodiments, the sensor capacitance is compared to a reference capacitance, which may be substantially equal to the sensor capacitance in the absence of the interaction. In addition, the selective coating may be exposed to a fluid and the presence of an analyte in the fluid may be determined from the measurement of sensor capacitance. In various embodiments, a voltage is applied to the diaphragm to counteract deformation induced in the diaphragm by a charge from the fluid.

In general, in a third aspect, a method of fabricating a sensor includes forming a first cavity in a first surface of a substrate. A counterelectrode may then be formed in the first cavity, and a flexible diaphragm having a conductive portion may suspended over the first cavity. In addition, a selective coating for interaction with an analyte may be applied to a first face of the diaphragm outside of the first cavity.

In various embodiments, the method also includes forming a second cavity in a second surface of the substrate and forming holes in the substrate to fluidly connect the first and second cavities. A release channel may also be formed to vent the first cavity. In addition, a wall member may be coupled to the flexible diaphragm to form a fluidic channel between the diaphragm and the wall member.

These and other objects, along with advantages and features of the present invention herein disclosed, will become more apparent through reference to the following description, the accompanying drawings, and the claims. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which:

FIGS. 2A-2G are cross-sectional views depicting steps in a fabrication process of a measurement device in accordance with an embodiment of the invention;

FIGS. 5A-5G are cross-sectional views depicting steps in a fabrication process of a sensor in accordance with an embodiment of the invention;

DESCRIPTION

Described herein are various embodiments of sensors for detecting binding to or reaction with a selective material (i.e., an analyte). In one embodiment, a sensor includes a conductive diaphragm having a selective coating thereon, and a counterelectrode spaced from and in opposition to the diaphragm. As described herein, the diaphragm may deform upon interaction of the selective coating with the analyte and thereby alter a capacitance of the sensor in a manner indicative of a degree of interaction.

Figure 1A:
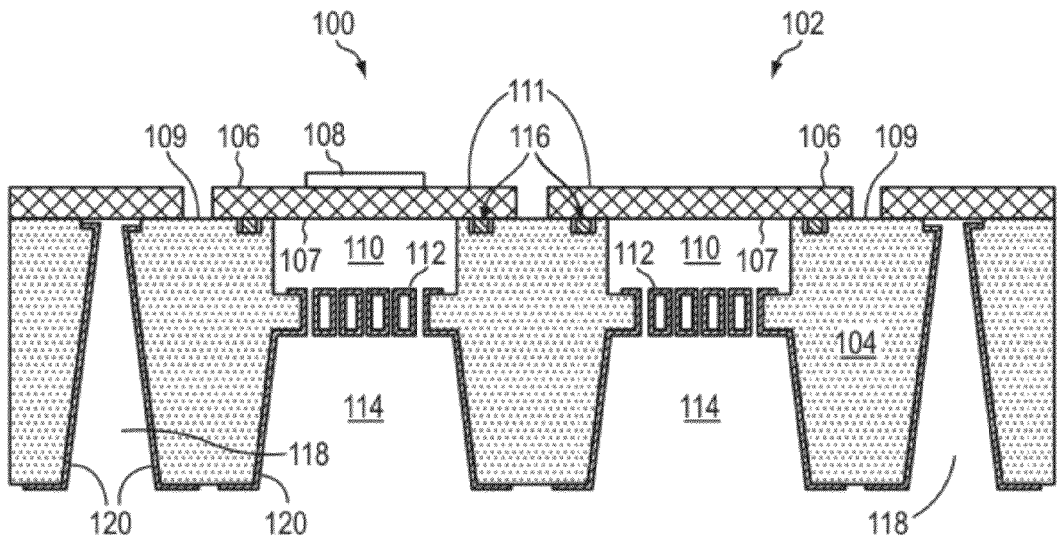
FIGS. 1A and 1B are a cross-sectional view and a plan view, respectively, of a measurement device in accordance with an embodiment of the invention.
Figure 1B:
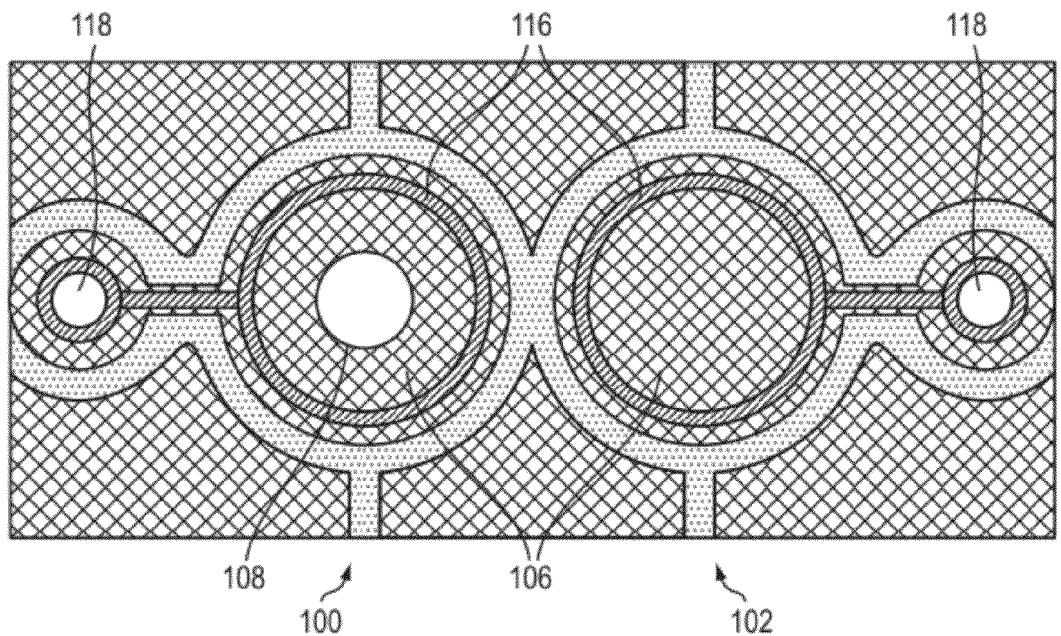

FIGS. 1A and 1B depict a cross-sectional view and a plan view, respectively, of a representative measurement device in accordance with a first embodiment of the invention. As illustrated, the measurement device may include a primary sensor 100 and a secondary sensor 102 that may act as a reference for the primary sensor 100. Each sensor 100, 102 may include a fixture or substrate 104, upon which a conductive diaphragm 106 is attached. As used herein, the term "conductive" generally means electrically conductive or semiconductive, as those terms are understood in the art. The substrate 104 may be any suitable insulating material, including, for example, a glass material such as PYREX, BOROFLOAT, or quartz. Use of an insulating material for substrate 104 may lower unwanted capacitances in the measurement device, such as stray, parasitic, or coupling capacitances, as compared to a substrate made from a conducting or semiconducting material. For example, an electrical signal produced by one sensor may be less likely to affect the operation of a second sensor because the two sensors may be electrically isolated by the insulating substrate 104. Furthermore, a conducting wire may be placed directly on the insulating substrate 104, without the need for further processing steps and materials to insulate the conducting wire from the substrate.

The diaphragm 106 may be circular (as illustrated), rectangular, or any other shape, and a surface 107 thereof may be flush or planar with a top surface 109 of the substrate 104. A selective coating 108, described in greater detail below, may be applied to a top face 111 of diaphragm 106 of the primary sensor 100. Because the diaphragm 106 is readily accessible (i.e., positioned on the top surface 109 of the substrate 104), the selective coating 108 may be easily regenerated if it deteriorates during usage. A first cavity 110, formed in the top surface 109 of the substrate 104, separates the diaphragm 106 from a lower conductive electrode 112. In an embodiment, a second cavity 114, formed in the back side of the substrate 104, defines a back face of the lower electrode 112.

As described further below, etching or otherwise forming a cavity (e.g., cavities 110, 306, and 410 depicted in FIGS. 1A, 3B, and 4, respectively) directly in the top surface of a substrate involves fewer processing steps than forming a cavity over the substrate by, for example, depositing an annular or other structure on the top surface of the substrate.

Referring again to FIGS. 1A and 1B, an electrical connection 116 to the diaphragm 106 may be placed on the portion of the substrate 104 that contacts the diaphragm 106, or may be placed in a trench or channel in the top surface 109 of the substrate 104. The electrical connection 116 may encircle all or a portion of the diaphragm 106, as shown in FIG. 1B, creating a low-resistivity connection to the diaphragm 106. Through wafer interconnect vias 118 may provide a path for the electrical connection 116 to the back side of the substrate 104. For example, back-side metallization 120 may be deposited on the surface of the vias 118 and provide electrical connections from diaphragm 106 and from lower electrode 112 to an electrical circuit. In one embodiment, connecting the electrical circuit to the back side of substrate 104 isolates the electrical circuit and its electrical connections from an analyte or an analyte-bearing medium that interacts with the coating 108.

In some embodiments, it is important to maintain substantially equal pressure on both sides of the diaphragm 106 during operation. One or more of several approaches may be followed in this regard. As illustrated in FIG. 1A, the counterelectrode 112 may include one or more perforations therethrough. Moreover, the substrate 104 may include one or more apertures or valves to form a release channel from cavity 110; desirably, these are placed outside the coating and diaphragm area where they will not interfere with deflection. The release channel may be formed through the substrate 104 (see FIG. 3B). Alternatively, the diaphragm 106 may not be attached to the substrate 104 at every point along its perimeter (see FIG. 4). In such a case, the resulting gap or release channel between the substrate 104 and a portion of the diaphragm 106 serves to equalize pressure on both sides of the diaphragm 106. In each of these cases, the pressure equalizing means prevents the cavity 110 (and cavities 306 and 410 depicted in FIGS. 3B and 4, respectively) from being under vacuum.

The diaphragm 106 may be formed of any conductive material (e.g., a metal, a pigment-loaded polymer, or a semiconductor) and be of a thickness that is small enough to undergo measurable deformations as a result of analyte interactions with the coating 108, while still being capable of withstanding repeated stresses. Moreover, it is preferred that the diaphragm 106 be compositionally uniform throughout its extent because, for example, diaphragms having multiple layers with different thermal-response properties may produce thermal distortion. As explained in more detail below, the sensors 100, 102 may be fabricated in many ways, e.g., by micromachining or by conventional silicon-processing techniques. For example, the diaphgram 106 and the substrate 104 may be created from standard six-inch silicon wafers using masking and reactive-ion etching techniques. A representative device may be, for example, 500 µm long, 1000 µm wide, and 1.5 µm thick.

Selective coating 108 may comprise a chemical moiety that binds to an analyte of interest. The moiety may be (or reside on or be bound to, e.g., covalently) a polymer, nucleic acid, a polypeptide, a protein nucleic acid, a substrate interactive with a polypeptide (e.g., an enzyme), an enzyme interactive with a substrate, an antibody interactive with an antigen, an antigen interactive with one or more antibodies, or other biomolecule.

The sensors 100, 102 may be used to detect the presence of an analyte of interest in a candidate solution to which selective coating 108 is exposed. If stress on the diaphragm 106 above a noise threshold is observed (i.e., the diaphragm 106 deforms to a degree great enough to change the capacitance of the sensor in question by more than a threshold value), then the presence of the analyte in the candidate solution is confirmed. More elaborate measurements may provide further information, e.g., an estimate of the concentration of the analyte. This estimation may be accomplished by monitoring the extent of binding over time, and generally requires some empirically predetermined relationships between concentration and binding behavior. Less than complete equilibrium saturation of coating 108, for example, as reflected by a final reading below the maximum obtainable under full saturation conditions, may offer a direct indication of concentration. If saturation is reached, the time required to achieve this condition, or the time-stress profile (i.e., the change in observed stress over time) may indicate concentration-again, typically, by comparison with reference profiles previously observed for known concentrations.

In certain embodiments, an undesirable bending may be induced in the diaphragm 106 of the primary sensor 100 by a charge transferred to the diaphragm 106 from a charge-bearing component other than the analyte, such as a salt or an electrolyte, in the candidate solution. The charge-bearing component in the candidate solution may cause a similar degree of bending in the diaphragm 106 of the secondary sensor 102. The secondary sensor 102 may be configured as a reference to the primary sensor 100, and the undesirable bending of the diaphragm 106 of the primary sensor 100 may thus be compensated for. This compensation allows for a more accurate measurement of the bending induced in the diaphragm 106 of the primary sensor 100 due to the interaction of the analyte and the coating 108.

FIGS. 2A-2G are cross-sectional views depicting steps in a fabrication process of a sensor in accordance with a first embodiment of the invention. In FIG. 2A, a substrate 104 of thickness A is shown. The substrate 104 may be etched to form both through-wafer interconnect vias 118 with an upper width B and back cavities 114 with an upper width C. Alternatively, the substrate 104 may be provided by a commercial vendor, such as Berliner Glas US, and may be pre-formed with vias 118 and back cavities 114. The substrate 104 thickness A may be approximately 0.5-1.0 mm, the via 118 upper width B may be approximately 100 µm, and the back cavity 114 upper width C may be approximately 0.5-1.0 mm.

As shown in FIG. 2B, the substrate 104 may be further etched to form front cavities 110 and metal interconnect channels 202. The depth D of the front cavities 110 may be approximately 3 µm. Any appropriate etching process, such as wet etching, Oxford reactive-ion etching, or STS reactive-ion etching, may be used. The thickness of a structure 203 for supporting the lower electrodes 112, formed by the etching of the front cavities 110, may be approximately 20-50 µm. As shown in FIG. 2C, front-side metallization 204 may be deposited to form, for example, lower electrodes 112 and/or metal interconnect in the channels 202, and damping reduction holes 206 may be formed in the support structure 203. As shown in FIG. 2D, back-side metallization 120 may also be deposited, as appropriate. The metal applied may be gold, platinum, copper, aluminum, or another conductor used in semiconductor processing, and may be applied to achieve a thickness of approximately 0.05-0.5 µm.

As shown in FIG. 2E, a silicon-on-insulator ("SOI") wafer 208 may be bonded to the top of the substrate 104. As illustrated, the SOI wafer 208 may feature a handle wafer 210, an insulator layer 212, and a silicon layer 214. The SOI wafer 208 may be bonded to the substrate 104 such that the silicon layer 214 contacts the substrate 104. The SOI wafer 208 may be purchased from a commercial vendor or created with techniques well known in the semiconductor art.

As shown in FIG. 2F, the SOI wafer 208 may be ground and/or etched by any of numerous conventional techniques to remove the handle wafer 210. Insulator layer 212 may be removed with, for example, a hydrofluoric acid solution. As shown in FIG. 2G, the silicon layer 214 may be etched to form structures including, for example, a diaphragm 106 suspended over the cavity 110. Coating 108 may then be applied to the top, exposed surface 108 of the diaphragm 106.

Figure 3A:
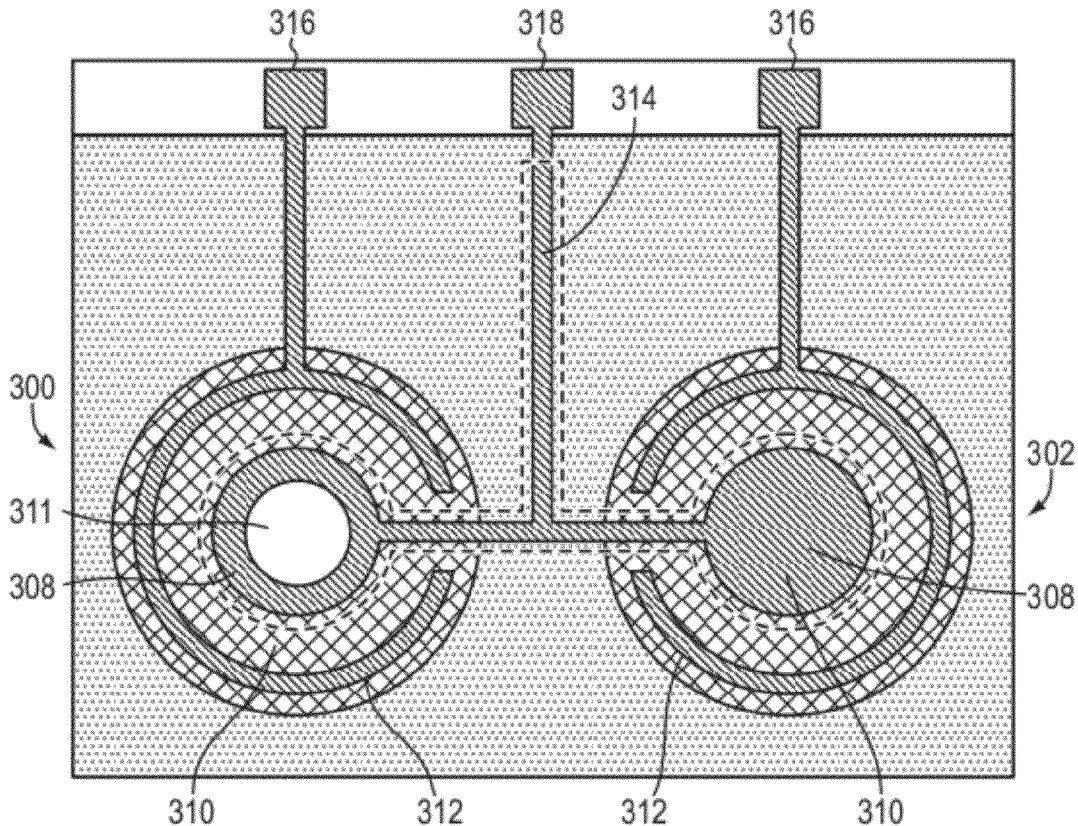
FIGS. 3A and 3B are a plan view and a cross-sectional view, respectively, of a measurement device in accordance with another embodiment of the invention.
Figure 3B:
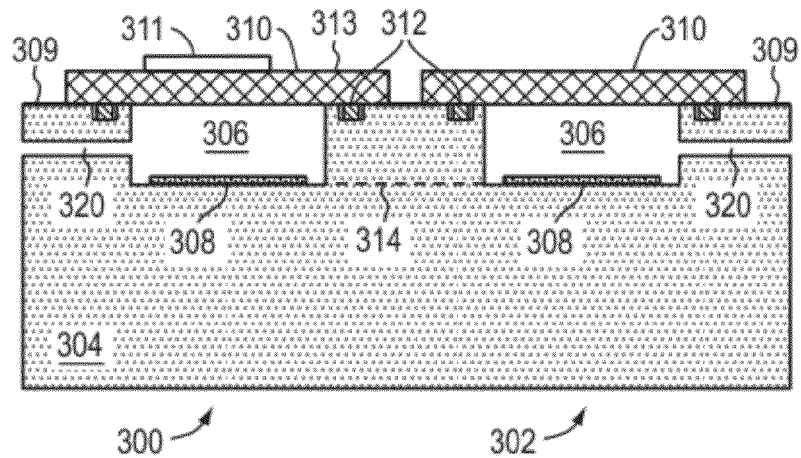

FIGS. 3A and 3B depict a second embodiment of the invention in which a measurement device is shown in a plan view and a cross-sectional view, respectively. Again, the measurement device may include a primary sensor 300 and a secondary sensor 302 that may act as a reference for the primary sensor 300. In this embodiment, cavities 306 are formed in a top surface 309 of the substrate 304. A lower electrode 308 may be formed at the bottom of the cavity 306 by, for example, depositing a layer of metal, and a diaphragm 310 may be suspended over the cavity 306. A selective coating 311 may be applied to a top face 313 of diaphragm 310 of the primary sensor 300. As previously shown in FIGS. 1A and 1B, a metal 312 may be deposited on the top surface 309 of substrate 304 around the perimeter of diaphragm 310 to make an electrical connection to the diaphragm 310. Alternatively, the metal may be deposited in a trench formed in the top surface 309 of the substrate 304. Another trench may be formed, of a depth approximately equal to the depth of the cavities 306, to make an electrical connection 314 to the lower electrode 308. As indicated by the dashed lines in FIGS. 3A and 3B, the trench may be subsequently re-filled with the substrate material to bury the electrical connection 314 to the lower electrode 308 beneath the surface 309 of the substrate 304. As shown in FIG. 3A, the electrical connections 312 extend to upper electrode contacts 316 and the electrical connection 314 extends to lower electrode contact 318. A release channel 320 in communication with a cavity 306 may be formed in the substrate 304 and an aperture or a valve used in connection therewith in order to vent the first cavity 306 and maintain equal pressure on both sides of the diaphragm 310. Alternatively, a gap between the top surface 309 of the substrate 304 and the diaphragm 310 may be employed to maintain equal pressure on both sides of the diaphragm 310.

Figure 4:
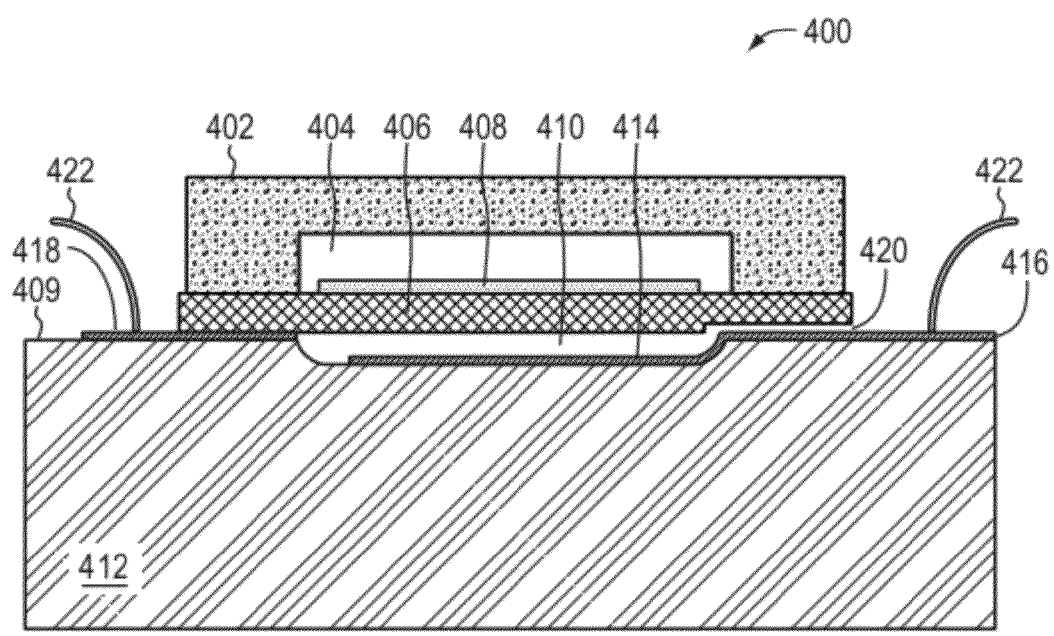
FIG. 4 is a cross-sectional view of a single sensor in accordance with an embodiment of the invention.

FIG. 4 depicts a cross-sectional view of a sensor 400 in accordance with another embodiment of the invention. In this embodiment, a wall member 402 is attached to the top surface of the diaphragm 406, thereby defining a fluidic channel 404 between the wall member 402 and diaphragm 406. As in other embodiments of the invention, the diaphragm 406 may be circular, rectangular, or any other shape. A selective coating 408 may be bonded to the top surface of the diaphragm 406 within the fluidic channel 404. The wall member 402 may be formed from a polymer, such as, for example, polydimethylsiloxane ("PDMS"). Fluid may be caused to flow within the channel 404 and the sensor 400 may be employed to analyze fluids containing an analyte of interest. The fluids may be supplied by external sources, which may connect to the fluidic network defined by the wall member 402 of the sensor 400. The wall member 402 may also be used to isolate the fluid from an electrical circuit placed on, for example, a top surface 409 of the substrate 412.

In one embodiment, a cavity 410, which may be formed in the top surface 409 of the substrate 412, separates the diaphragm 406 from a lower electrode 414 that is formed as part of front-side metallization 416. Either a gap 420 between the diaphragm 406 and the front-side metallization 416 or an aperture or valve in substrate 412 may serve as a release channel to equalize pressure on both sides of the diaphragm 406. In one embodiment, the gap 420 does not extend across the entire side of diaphragm 406. As illustrated in FIG. 4, wirebond leads 422 may be used to electrically connect the diaphragm 406 (through front-side metallization 418) and lower electrode 414 (through front-side metallization 416) to an electrical circuit. In addition, a second sensor may be formed near the sensor 400 and be used as a reference device.

The second sensor may be designed so as not to deflect in the presence of an analyte. For example, it may have a fluidic channel that prevents an analyte-bearing fluid from contacting a selective coating 408 or it may lack a selective coating 408 altogether.

FIGS. 5A-5G are cross-sectional views depicting steps in a fabrication process of the sensor 400 in accordance with one embodiment of the invention. FIG. 5A shows the substrate 412 with front-side metallization 416, 418 applied thereto. In FIG. 5B, the front-side metallization 416, 418 may be used as a mask to form a cavity 410 with, for example, a wet etch process or other suitable process. The lower electrode 414 may then be formed as shown in FIG. 5C. In one embodiment, the lower electrode 414 is formed so as to contact part of the front-side metallization 416, which may electrically connect the lower electrode 414 to measurement circuitry, but not to contact another part of the front-side metallization 418, which may later serve to electrically connect the diaphragm 406 to measurement circuitry.

As shown in FIG. 5D, a silicon layer 214 of an SOI wafer 208 may then be bonded to the top of the substrate 412. The SOI wafer 208 may also feature a handle wafer 210 and an insulator layer 212. The handle wafer 210 and insulator layer 212 may be removed, as shown in FIG. 5E, to leave the silicon layer 214 bonded to the top of the substrate 412, and a selective coating 408 may be applied to the top surface of the silicon layer 214. As shown in FIG. 5F, portions of the silicon layer 214 may be removed with, for example, an etching process, to define the diaphragm 406. Finally, as shown in FIG. 5G, a wall member 402 may be formed on the top surface of the diaphragm 406 to enclose the selective coating 408 and define a fluidic channel 404 between the diaphragm 406 and wall member 402. Alternatively, the selective coating 408 may be applied to the diaphragm 406 after the formation of the fluidic channel 404 by flowing a coating-bearing fluid through the fluidic channel 404 and depositing the borne coating on diaphragm 406. As also illustrated in FIG. 5G, wirebond leads 422 may be connected to the front-side metallization 416, 418.

Figure 6:
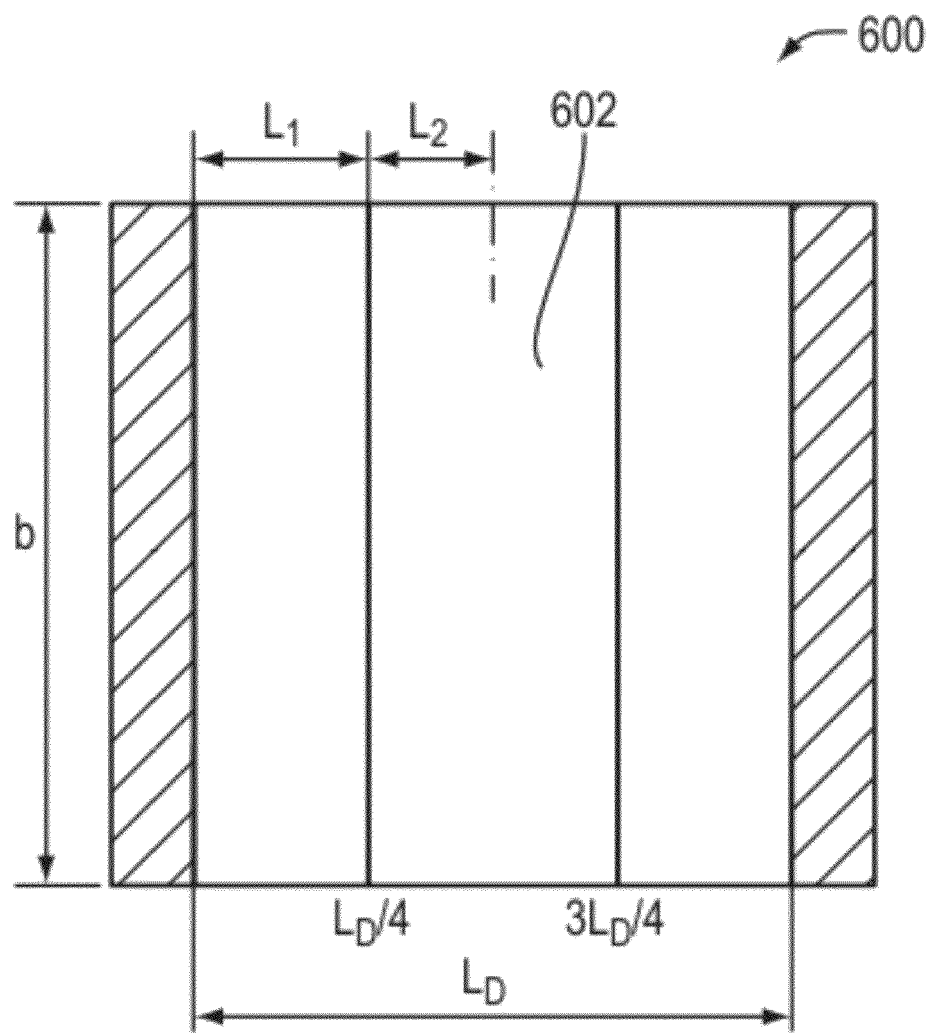
FIG. 6 is a plan view of a coated diaphragm in accordance with an embodiment of the invention.

For each of the diaphragms 106, 310, 406 described above, knowledge of the dynamics of its behavior may facilitate a priori measurements even in the absence of reference data. Such knowledge may also dictate design of a device. With reference to FIG. 6, an exemplary approach utilizes a rectangular diaphragm 600 whose length $L_D$ is less than half its width b (i.e., $b>2L_D$), and which is secured along all edges. Because the width b is sufficiently greater than the length $L_D$, this configuration may be accurately modeled as a simple beam. Assume, for example, that the diaphragm 600 is made of an elastic material, such as silicon, of thickness $h_{Si}$, and that the coating 602 has a uniform thickness $h_c$, covers 50% of the area of diaphragm 600, and extends from $L_D/4$ to $3L_D/4$. Binding of an analyte to coating 602 exerts a compressive or tensile stress on the silicon diaphragm 600. Although the stress is probably biaxial, the ensuing beam analysis considers only the lengthwise stress that deflects the diaphragm 600.

A reasonable estimate of the Young's modulus of coating 602 is 1% that of silicon (hereinafter $Y_{Si}$), a value typifying many polymers. As an upper limit on stress, it is assumed that the film can shrink 1% if not restrained; consequently, the stress available for deforming the diaphragm is $10^{-4} Y_{Si}$.

The axial adhesion axial force may be modeled as a torque couple applied at $x=L_D/4$ and $x=3L_D/4$. In such a case, the torque magnitude is:

$$M = \epsilon_c Y_c b h_c (y_c - y_{om}) \qquad \text{Eq. 1}$$

where $Y_c$ is the coating's Young's modulus ($1.68 \times 10^{-9}$ N/m²); $\epsilon_c$ is the unrestrained strain (0.01); b is the width of diaphragm 600 (the coating 602 traverses the entire width b); $h_c$ is the thickness of coating 602 plus analyte ($10^{-9}$ m, one monolayer coating and one of analyte); and ($y_c - y_{om}$) is the vertical distance between coating's center and the neutral axis for torque inputs when a pure torque is applied.

Figure 7:
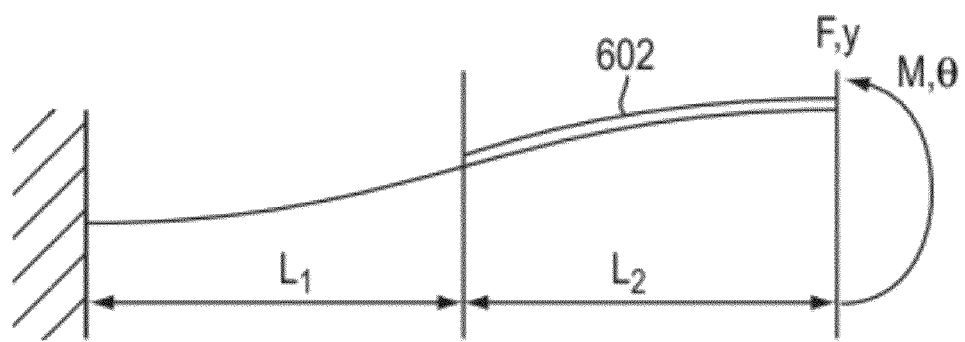
FIG. 7 graphically depicts the bending behavior of the diaphragm shown in FIG. 6.
Figure 8:
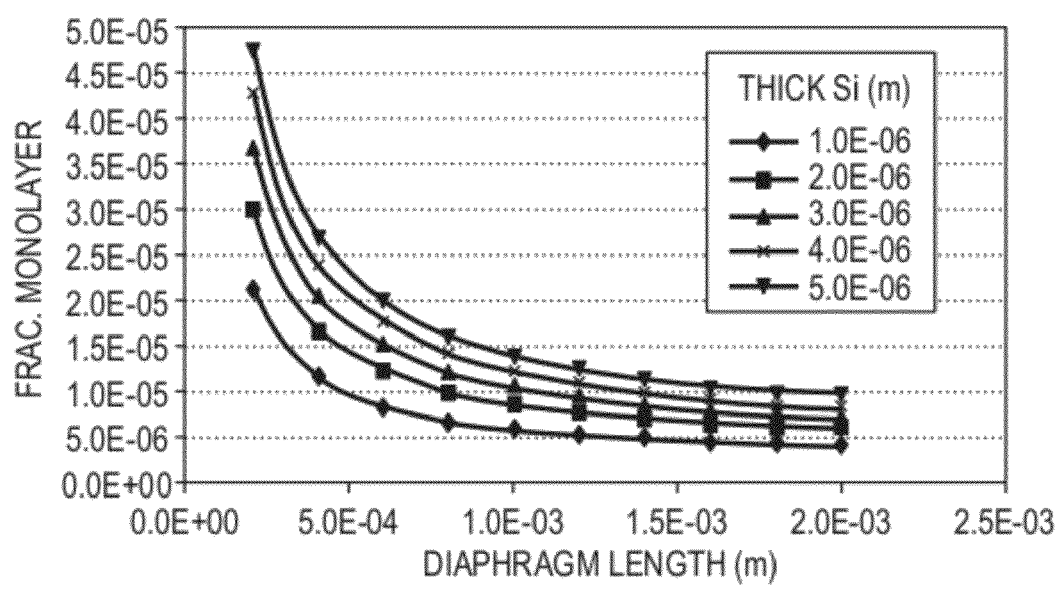
FIG. 8 graphically depicts the resolvable fraction of an analyte molecular layer versus diaphragm length and thickness.
Figure 9:
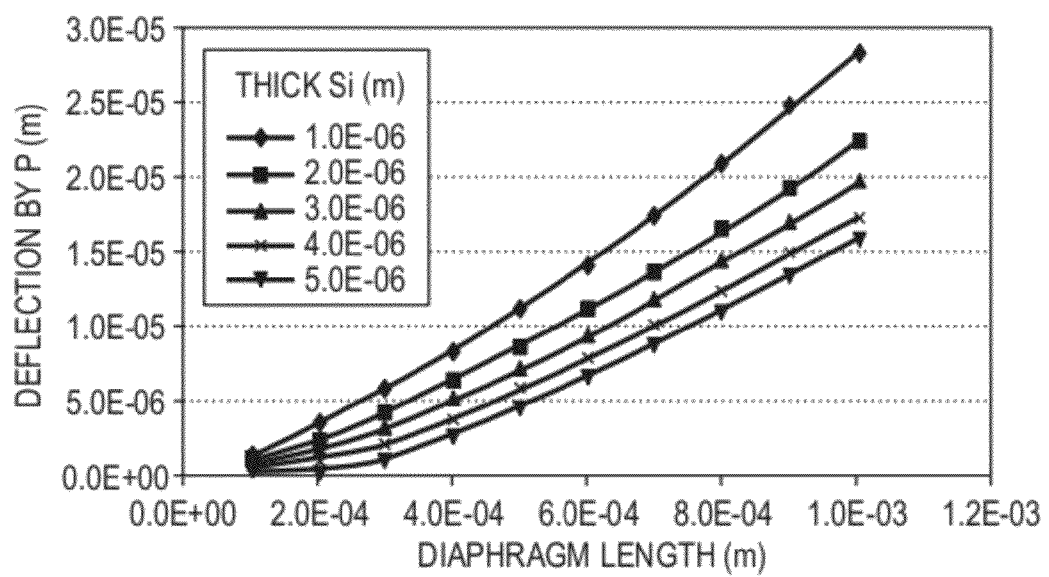
FIG. 9 graphically depicts the relationship of maximum deflection from baseline due to 1 atmosphere pressure across a diaphragm versus diaphragm length and thickness.
Figure 10:
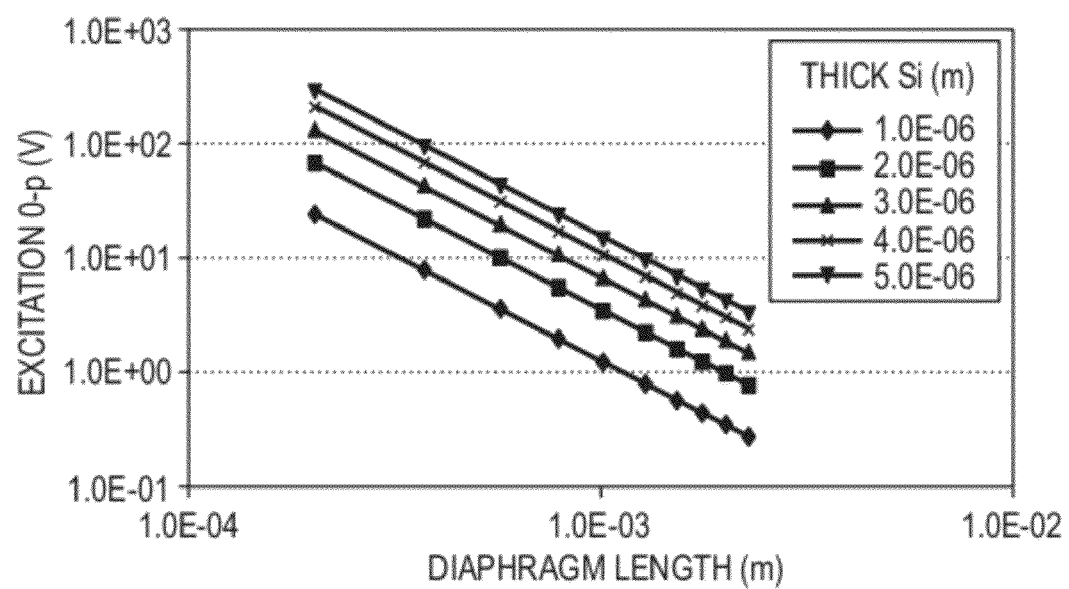
FIG. 10 graphically depicts excitation voltage as limited by snap-down versus diaphragm length and thickness.
Figure 11:
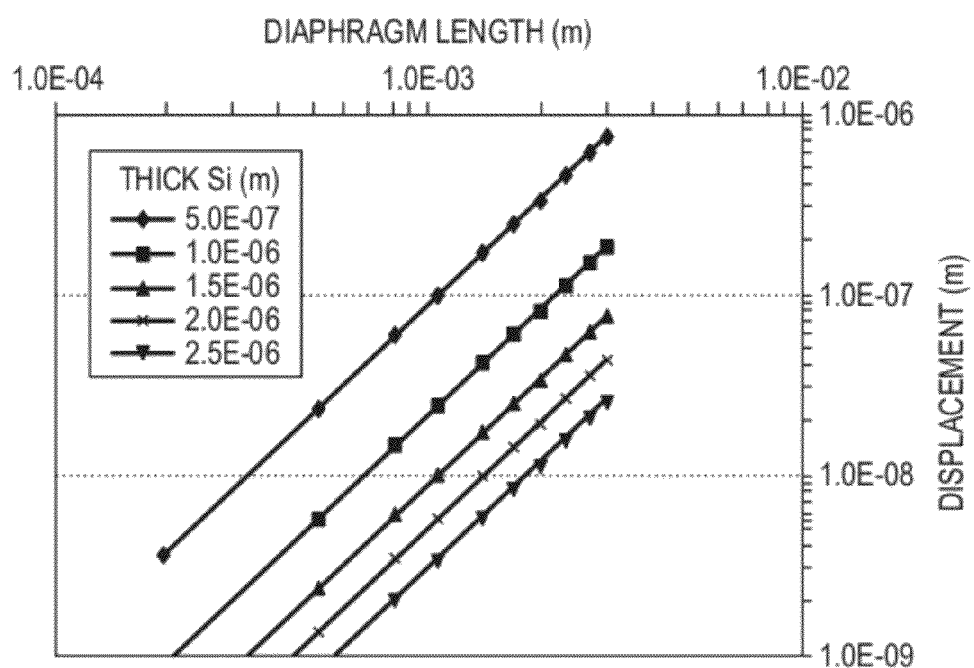
FIG. 11 graphically depicts deflection caused by a single analyte layer versus diaphragm length thickness.

With the coating 602 covering the central portion of the diaphragm 600 ($L_1 = L_2$ in FIG. 6), the maximum deflection is:

$$y_{cen} = \frac{ML_D^2}{8R_M} \qquad \text{Eq. 2}$$

where $L_D$ is the diaphragm length (assumed less than 50% b) and $R_M$ is the radius of curvature for unit torque (the sum of the YI terms where the inertia products I are calculated about the torque neutral axis). This is illustrated in FIG. 7. The point force required to deflect the diaphragm 600 center is given by:

$$F_{cen} = k_{cen} y_{cen} = \frac{192 R_M}{L_D^3} y_{cen} \qquad \text{Eq. 3}$$

The deflections and strains of diaphragm 600 in response to varying loads are straightforwardly determined (indeed, published tables may be employed; see, e.g., R. J. Roark and W. Young, *Formulas for Stress and Strain*, McGraw-Hill (5th ed. 1975), page 408). Among several cases, values may be tabulated for held and fixed edges where the larger dimension is 1.5 times the smaller dimension. For this situation, the plate can be modeled as very wide (the plane strain assumption) so that the low-pressure results can be compared to tabulated closed-form solutions.

Figure 12:
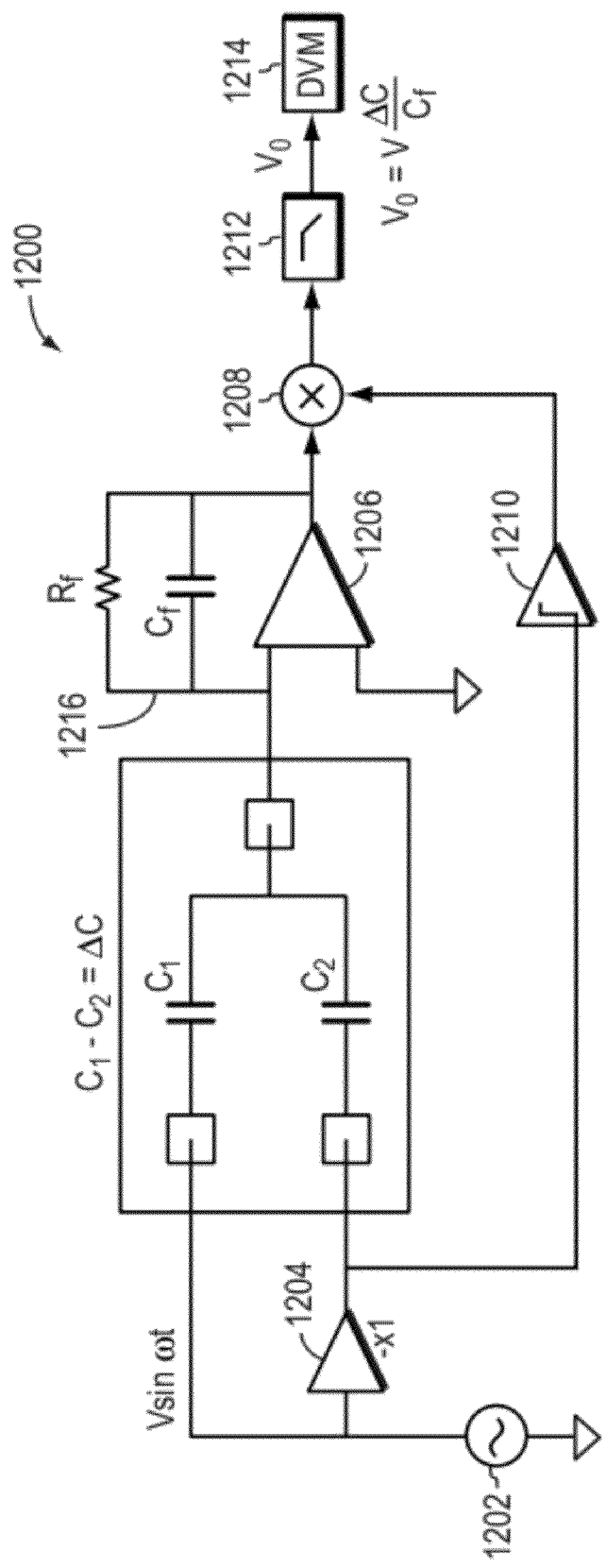
FIG. 12 schematically depicts a detection circuit useful in conjunction with embodiments of the invention.

A representative circuit 1200 suitable for use in connection with embodiments of the present invention and offering precise capacitance measurements is shown in FIG. 12. The circuit 1200 may be completely isolated from any surface that may be exposed to an analyte or any medium bearing an analyte, thereby sparing the circuit 1200 from the potentially damaging effects of such exposure and extending the operational lifetime of the circuit 1200. The circuit 1200 includes two sensors, such as the sensors 100, 102, 300, 302, 400 described above, each having an identical baseline capacitance and indicated at $C_1$, $C_2$. The capacitance of a single sensor is given by:

$$C_s = \frac{\epsilon b L_D F_{sd}}{g_s} \qquad \text{Eq. 4}$$

where $\epsilon$ is the permittivity of free space ($8.85 \times 10^{-12}$ F/m), $g_s$ is the capacitor air gap (e.g., 3 µm), and $F_{sd}$ is the bridge construction factor (50%). In one embodiment, for efficient design, the counterelectrode is not built under the diaphragm portion that does not deflect vertically.

In one embodiment, the sensors $C_1$, $C_2$ are identical but only one (e.g., $C_1$) is exposed to a candidate fluid. The other ($C_2$) is used as a baseline reference, and desirably experiences the same thermal environment as $C_1$. Alternatively, the reference device may lack a selective coating, in which case it, too, may be exposed to the candidate fluid. One "plate" (i.e., the diaphragm) of sensor $C_1$ receives a time-varying voltage signal Vsin ωt from an AC source 1202, and the same plate of sensor $C_2$ receives an inverted form of the same signal via an inverter 1204. The other plates (i.e., the counterelectrodes) of sensors $C_1$, $C_2$ are connected together and to the inverting input terminal of an operational amplifier 1206. Accordingly, if the capacitances of $C_1$, $C_2$ were identical, the resulting voltage would be zero due to inverter 1204.

Operational amplifier 1206 is connected in a negative feedback circuit. The non-inverting terminal is at ground potential, so the output voltage is proportional to the voltage difference $\Delta C = C_1 - C_2$. A feedback resistor $R_f$ and a feedback capacitor $C_f$ bridge the inverting input terminal and the output terminal of the amplifier 1206. The output of amplifier 1206 is fed to an input terminal of a voltage multiplier 1208. The other input terminal of multiplier 1208 receives the output of a device 1210, such as a Schmitt trigger, that produces a rectangular output from the sinusoidal signal provided by inverter 1204. When configured in this fashion, multiplier 1208 acts to demodulate the signal from amplifier 1206, and a low pass filter 1212 extracts the DC component from the demodulated signal. The voltage read by the digital voltmeter (DVM) 1214 is therefore $$V_O = V_{rms} \frac{\Delta C}{C_f} \left( \text{for values of } R_f \text{ such that } R_f \gg \frac{1}{\omega C_f} \right).$$

DVM 1214 ordinarily includes a display and is desirably programmable, so that the received voltage may be converted into a meaningful reading. In one embodiment, DVM 1214 allows the user to specify a threshold and, if the sensed voltage exceeds the threshold, DVM 1214 indicates binding of the analyte of interest to coating 602. More elaborately, DVM 1214 monitors and stores the voltage as it evolves over time, and includes a database relating voltage levels and their time variations to concentration levels that may be reported.

Noting that both an active and reference capacitor are attached to the amplifier 1206 inputs, the minimum detectable diaphragm rms position signal is determined by:

$$g_{res} = g_s \frac{V_N}{V_x} \frac{(2C_s + C_N + C_{fb})}{C_s} \sqrt{2 f_{band}} \qquad \text{Eq. 5}$$

where $V_N$ is the preamplifier input voltage noise (6 nV/√Hz), $V_x$ is the excitation voltage specified as zero to peak, $f_{band}$ is the frequency bandwidth over which measurement is taken (1 Hz), $C_{fb}$ is the feedback capacitance (2 pF), and $C_N$ is the additional capacitance attached to preamplifier input node (3 pF). The factor of two under the square root involves the conversion of zero to peak voltages to rms uncertainty. Dividing $g_{res}$ by the deflection for a monolayer determines the fraction of a layer that can be resolved. The zero to peak excitation voltage is desirably set at 50% of the diaphragm's DC snap-down voltage. For this calculation, the counterelectrode is assumed to be rigid. The excitation voltage moves the diaphragm a few percent of the capacitor gap toward the counterelectrode. The DC snap-down voltage is calculated according to:

$$V_{snap} = \sqrt{\frac{8 k_{cen} g_s^3}{27 L_D b F_{sd} \epsilon}} \qquad \text{Eq. 6}$$

The circuit 1200 may behave differently if the candidate fluid is electrically conducting. For example, if a conducting fluid is allowed to make an electrical connection between a diaphragm of a capacitor $C_1$, $C_2$ and ground, the circuit 1200 may not operate properly. More specifically, as the diaphragms of the capacitors $C_1$, $C_2$ are connected to the virtual ground terminal 1216 of the operational amplifier 1206, a connection from the virtual ground 1216 to actual ground through the conducting fluid may cause the circuit 1200 to stop sensing the capacitance difference $\Delta C$.

Figure 13:
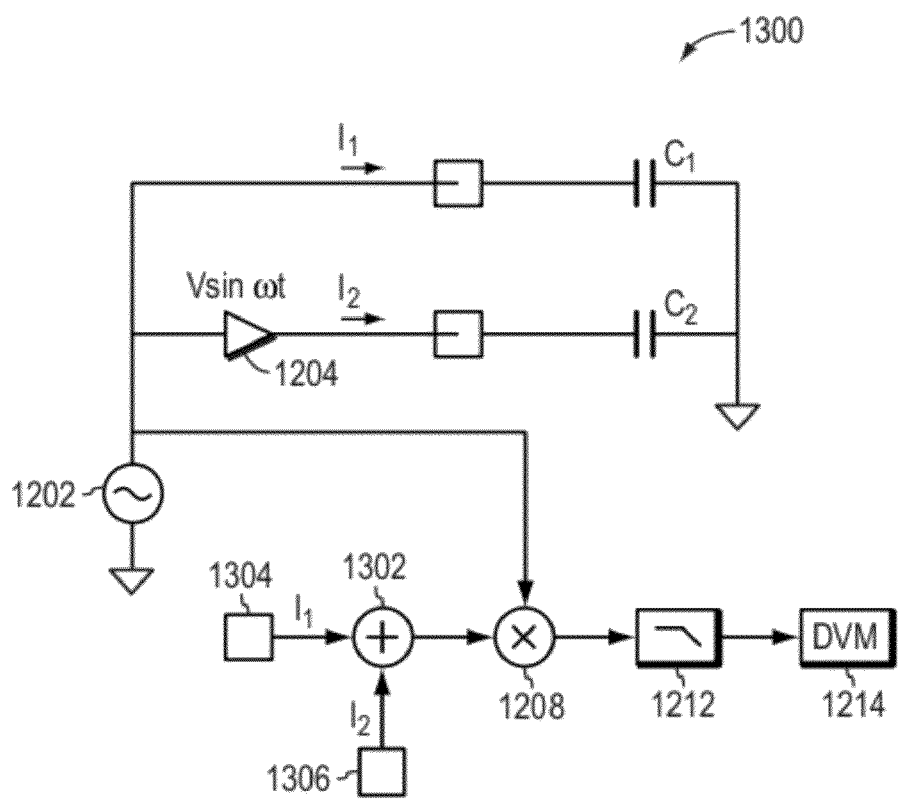
FIG. 13 schematically depicts a modified detection circuit useful in conjunction with embodiments of the invention in the presence of a conducting fluid.

Accordingly, FIG. 13 shows, in one embodiment, how the circuit 1200 may be modified to sense an analyte in a conducting fluid. In the modified circuit 1300, the diaphragms of the capacitors $C_1$, $C_2$ are connected to actual ground. In addition, current sensing circuits 1304, 1306 replicate the currents $I_1$ and $I_2$ flowing into capacitors $C_1$ and $C_2$, respectively. Each current sensing circuit 1304, 1306 may be, for example, a current mirror. A current summer 1302 sums the currents $I_1$ and $I_2$. The output of current summer 1302 is applied to multiplier 1208, as is the time-varying voltage signal V sin $\omega t$ from the AC source 1202. As previously described, the action of multiplier 1208, low pass filter 1212, and DVM 1214 outputs a voltage representative of the change in capacitance, $\Delta C=C_1-C_2$. Because the signal supplied to the reference capacitor $C_2$ is the inverse of the signal supplied to capacitor $C_1$ (due to the action of inverter 1204), any common deformation in the diaphragms of the capacitors $C_1$ and $C_2$ (due, for example, to a variation in temperature common to both sensors $C_1$ and $C_2$) produces substantially equal changes in the magnitudes of the currents $I_1$ and $I_2$ (which are opposite in sign) and, thus, no change in the output of the current summer 1302. Where, however, only the diaphragm of the capacitor $C_1$ deforms due to interaction of an analyte with the coating thereon, only the current $I_1$ flowing into capacitor $C_1$ changes. Such a change in the current $I_1$ is, consequently, reflected in the output of current summer 1302. Accordingly, the modified circuit 1300 may detect the movement of the diaphragm of the capacitor $C_1$ by sensing the current $I_1$ flowing into the capacitor $C_1$.

The thermal expansion coefficients are typically $20\times10^{-6}/^\circ$ C. for polymers compared to the 0.01 strain/layer assumed for the unrestrained coating plus analyte. These numbers suggest 0.002 layer/° C. thermal sensitivity.

The relationships between diaphragm length and thickness and (i) the resolvable fraction of an analyte molecular layer, (ii) the maximum deflection from baseline due to 1 atmosphere pressure across diaphragm 600, (iii) the excitation voltage as limited by snap-down for the baseline case (see below), and (iv) analyte-induced deflection are illustrated in FIGS. 8-11, respectively. As the diaphragm is made thinner or longer, the snap-down voltage decreases so that the changes in resolution are small and are roughly proportional to the quantity $\sqrt{L_D h_{Si}}$. As plotted in FIG. 10, the snap-down voltage is proportional to $L_D^2 h_{Si}^{3/2}$ (diaphragm length and thickness) so that the excitation voltage varies widely. The excitation voltage is a principal consideration in selecting diaphragm dimensions.

Although the present invention has been described with reference to specific details, it is not intended that such details should be regarded as limitations upon the scope of the invention, except as and to the extent that they are included in the accompanying claims. In addition, having described certain embodiments of the invention, it will be apparent to those of ordinary skill in the art that other embodiments incorporating the concepts disclosed herein may be used without departing from the spirit and scope of the invention. Accordingly, the described embodiments are to be considered in all respects as only illustrative and not restrictive.

What is claimed is:

1. A sensor comprising:
   a substrate having a first cavity formed in a first surface thereof;
   a diaphragm suspended over the first cavity and comprising a conductive portion;
   a selective coating, that binds to an analyte of interest, on a first face of the diaphragm outside of the first cavity; and
   a counterelectrode spaced from and in opposition to the diaphragm,
   wherein the diaphragm deforms upon interaction of the selective coating with the analyte and thereby alters a capacitance of the sensor in a manner indicative of a degree of interaction.

2. The sensor of claim 1 further comprising means for equalizing a pressure on each of the first face and a second face of the diaphragm.

3. The sensor of claim 2, wherein the pressure-equalizing means comprises perforations through the counterelectrode.

4. The sensor of claim 2, wherein the pressure-equalizing means comprises a release channel in communication with the first cavity.

5. The sensor of claim 4, wherein the release channel is formed through the substrate.

6. The sensor of claim 4, wherein the release channel is positioned between the diaphragm and the first surface of the substrate.

7. The sensor of claim 1 further comprising a wall member coupled to the diaphragm such that a fluidic channel is formed between the diaphragm and the wall member.

8. The sensor of claim 7, wherein the wall member comprises a polymer.

9. The sensor of claim 1 further comprising electronic circuitry for detecting presence of the analyte.

10. The sensor of claim 1 further comprising electronic circuitry for measuring a concentration of the analyte based at least in part on the capacitance.

11. The sensor of claim 1, wherein a second cavity is formed in a second surface of the substrate.

12. The sensor of claim 1, wherein the counterelectrode is positioned within the first cavity.

13. The sensor of claim 1 further comprising through-wafer interconnects coupled to the substrate.

14. The sensor of claim 1, wherein the substrate comprises glass.

15. The sensor of claim 1, wherein the selective coating comprises at least one of a polypeptide, an antibody, or an antigen.

16. A method of detecting binding to or reaction with a selective material, the method comprising:
   a) providing a sensor comprising:
      i) a substrate having a first cavity formed in a first surface thereof;
      ii) a diaphragm suspended over the first cavity and comprising a conductive portion;
      iii) a selective coating, that binds to an analyte of interest, on a first face of the diaphragm outside of the first cavity; and
      iv) a counterelectrode spaced from and in opposition to the diaphragm, wherein the diaphragm deforms upon interaction of the selective coating with the analyte and thereby alters a capacitance of the sensor; and
   b) measuring the sensor capacitance to determine a degree of interaction between the analyte and the selective coating.

17. The method of claim 16, wherein measuring the sensor capacitance comprises comparing the sensor capacitance to a reference capacitance.

18. The method of claim 17, wherein the reference capacitance is substantially equal to the sensor capacitance in the absence of the interaction.

19. The method of claim 16 further comprising exposing the selective coating to a fluid.

20. The method of claim 19 further comprising applying a voltage to the diaphragm to counteract deformation induced in the diaphragm by a charge from the fluid.

21. The method of claim 20 further comprising determining, from the measurement of the sensor capacitance, whether an analyte that binds to the coating is present in the fluid.

22. A method of fabricating a sensor, the method comprising:
forming a first cavity in a first surface of a substrate;
forming a counterelectrode in the first cavity;
suspending, over the first cavity, a flexible diaphragm comprising a conductive portion; and
applying a selective coating, that binds to an analyte of interest, to a first face of the diaphragm outside of the first cavity.

23. The method of claim 22 further comprising:
forming a second cavity in a second surface of the substrate; and
forming holes in the substrate to fluidly connect the first and second cavities.

24. The method of claim 22 further comprising forming a release channel to vent the first cavity.

25. The method of claim 22 further comprising coupling a wall member to the flexible diaphragm to form a fluidic channel between the diaphragm and the wall member.

* * * * *